(12) United States Patent
Kim et al.

(10) Patent No.: US 7,923,775 B2
(45) Date of Patent: Apr. 12, 2011

(54) SEMICONDUCTOR DEVICE AND METHOD FOR FABRICATING THE SAME

(75) Inventors: Kwang-Ok Kim, Icheon-si (KR); Hye-Ran Kang, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 47 days.

(21) Appl. No.: 12/333,224

(22) Filed: Dec. 11, 2008

(65) Prior Publication Data
US 2009/0242974 A1    Oct. 1, 2009

(30) Foreign Application Priority Data

Apr. 1, 2008   (KR) .................. 10-2008-0030163

(51) Int. Cl.
*H01L 29/739* (2006.01)
(52) U.S. Cl. ........ 257/331; 257/329; 257/330; 257/332; 257/E29.201; 438/156
(58) Field of Classification Search .................. 257/329, 257/330, 331, 332, E29.201; 438/156
See application file for complete search history.

(56) References Cited

U.S. PATENT DOCUMENTS

| | | | |
|---|---|---|---|
| 5,208,657 A * | 5/1993 | Chatterjee et al. | 257/302 |
| 6,952,033 B2 | 10/2005 | Kianian et al. | |
| 2006/0172483 A1* | 8/2006 | Forbes | 438/212 |

FOREIGN PATENT DOCUMENTS

| | | |
|---|---|---|
| CN | 101043024 | 9/2007 |
| JP | 2006-173429 | 6/2006 |
| JP | 2007-110110 | 4/2007 |
| KR | 1020050091500 | 9/2005 |
| KR | 1020060023308 | 3/2006 |

OTHER PUBLICATIONS

Office Action dated Jan. 21, 2010, for Korean application No. 10-2008-0030163, citing the above references.
Translation of Chinese Office Action for Chinese patent application No. 200910000358.3, citing the attached references.
Korean Notice of Allowance for Korean application No. 10-2008-0030163, citing the attached references.

* cited by examiner

*Primary Examiner* — Victor Mandala
(74) *Attorney, Agent, or Firm* — Lowe Hauptman Ham & Berner LLP

(57) ABSTRACT

A semiconductor device includes a plurality of trench patterns formed over a substrate; gate insulation layers formed over sidewalls of the trench patterns; gate electrodes formed over the trench patterns; line patterns coupling the gate electrodes; and source and drain regions formed in upper and lower portions of the substrate adjacent to the sidewalls of the trench patterns.

7 Claims, 7 Drawing Sheets

12

12

SEMICONDUCTOR DEVICE AND METHOD FOR FABRICATING THE SAME

CROSS-REFERENCE TO RELATED APPLICATIONS

The present invention claims priority of Korean patent application number 10-2008-0030163, filed on Apr. 1, 2008, which is incorporated herein by reference in its entirety.

BACKGROUND

The present invention related to a method for fabricating a semiconductor device, and more particularly, to a semiconductor device having a vertical channel and a method for fabricating the same.

Channels in semiconductor devices include recess, bulb, and fin type channels to expand the dimensions or length of the channel. However, while such semiconductor devices may have sufficient length or other dimensions of the channel, complex patterns have to be formed and cell efficiency has to be taken into consideration.

More specifically, in a semiconductor device having channels extended in a vertical direction with source and drain regions formed in upper and lower portions of pillar patterns, the pillar patterns may collapse and subsequently result in leaning of the pillar patterns.

FIGS. 1A, 1B, 1C, and 1D illustrate micrographic views of a typical semiconductor device having vertical channels. Referring to FIGS. 1A and 1B, collapse of pillar patterns are denoted with a reference numeral 11. Referring to FIGS. 1C and 1D, leaning of pillar patterns is denoted with a reference numeral 12.

Such undesirable formations may act as factors that deteriorate characteristics of a semiconductor device.

SUMMARY

Embodiments disclosed herein are directed to providing a method for fabricating a semiconductor device that can improve semiconductor device characteristics by preventing collapsing and leaning of pillar patterns.

One embodiment includes a semiconductor device having: a plurality of trench patterns formed over a substrate; gate insulation layers formed over sidewalls of the trench patterns; gate electrodes formed over the trench patterns; line patterns coupling the gate electrodes; and source and drain regions formed in upper and lower portions of the substrate adjacent to the sidewalls of the trench patterns.

In accordance with another embodiment, a method for fabricating a semiconductor device includes: forming a plurality of trench patterns over a substrate; forming gate insulation layers over sidewalls of the trench patterns; forming gate electrodes over the trench patterns; forming source and drain regions in upper and lower portions of the substrate adjacent to the sidewalls of the trench patterns; and forming line patterns coupling the gate electrodes.

DESCRIPTION OF EMBODIMENTS

Embodiments disclosed herein relate to a method for fabricating a semiconductor device that uses sidewalls of trenches as channel regions and omits a formation process of pillar patterns to prevent deterioration of semiconductor device characteristics which may be caused by pillar pattern collapsing events.

Figure 1A:
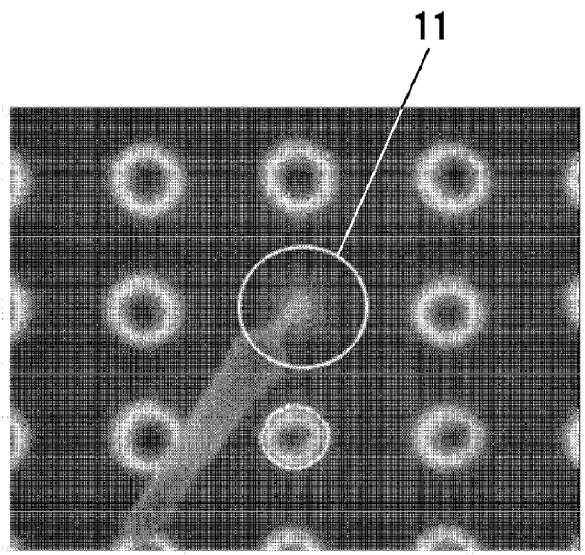
FIGS. 1A and 1B illustrate micrographic views of a typical semiconductor device having collapsing pillar patterns.
Figure 1B:
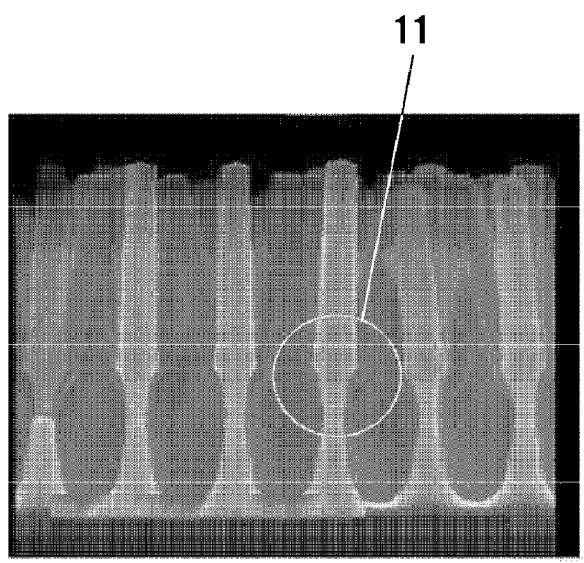
Figure 1C:
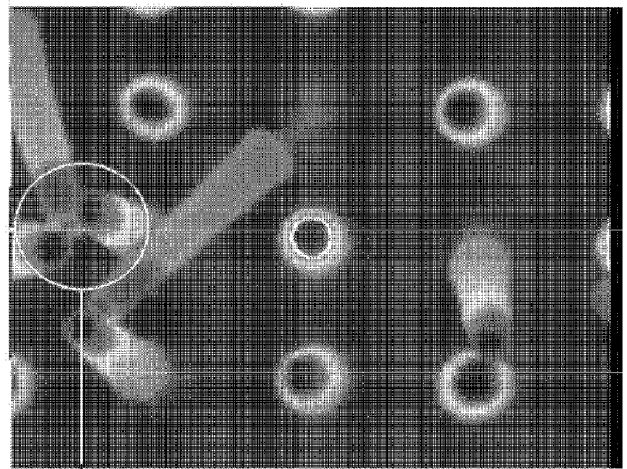
FIGS. 1C and 1D illustrate micrographic views of a typical semiconductor device having leaning pillar patterns.
Figure 1D:
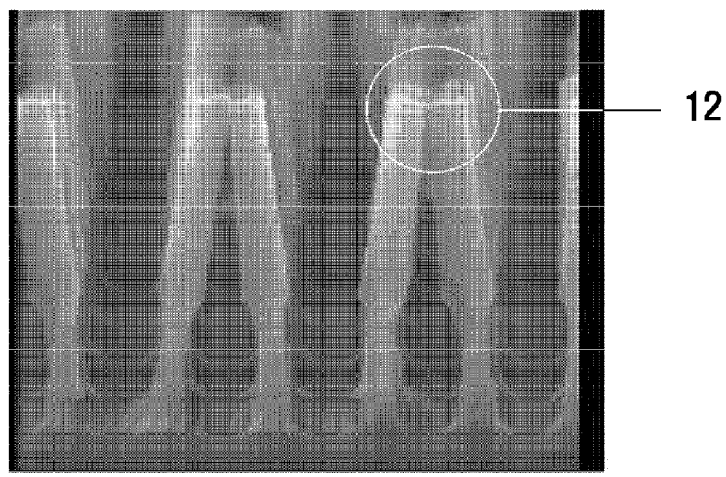
Figure 2A:
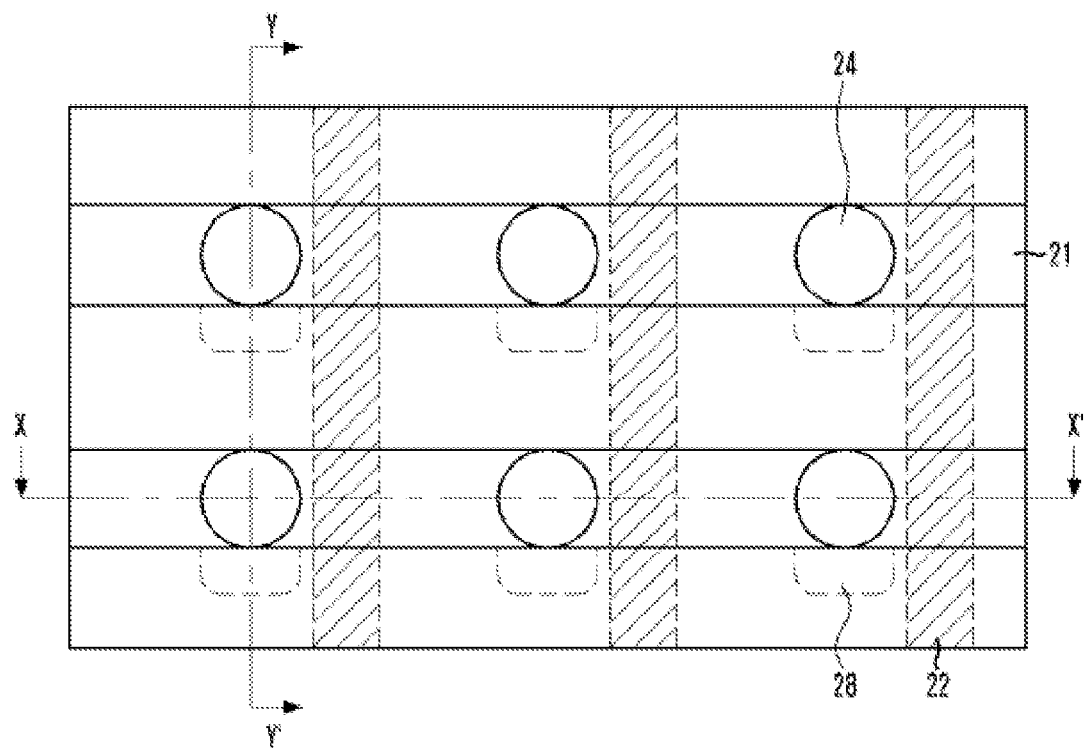
FIGS. 2A to 2C illustrate cross-sectional views of a semiconductor device having a vertical channel.
Figure 2B:
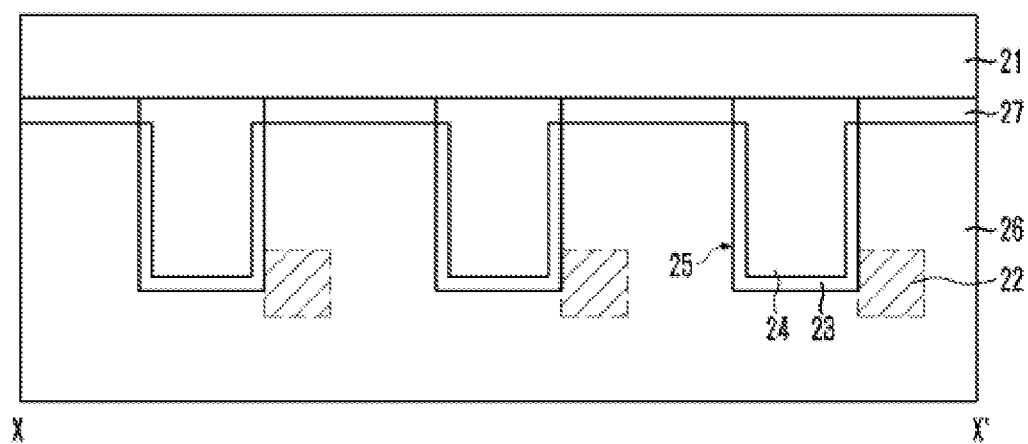
Figure 2C:
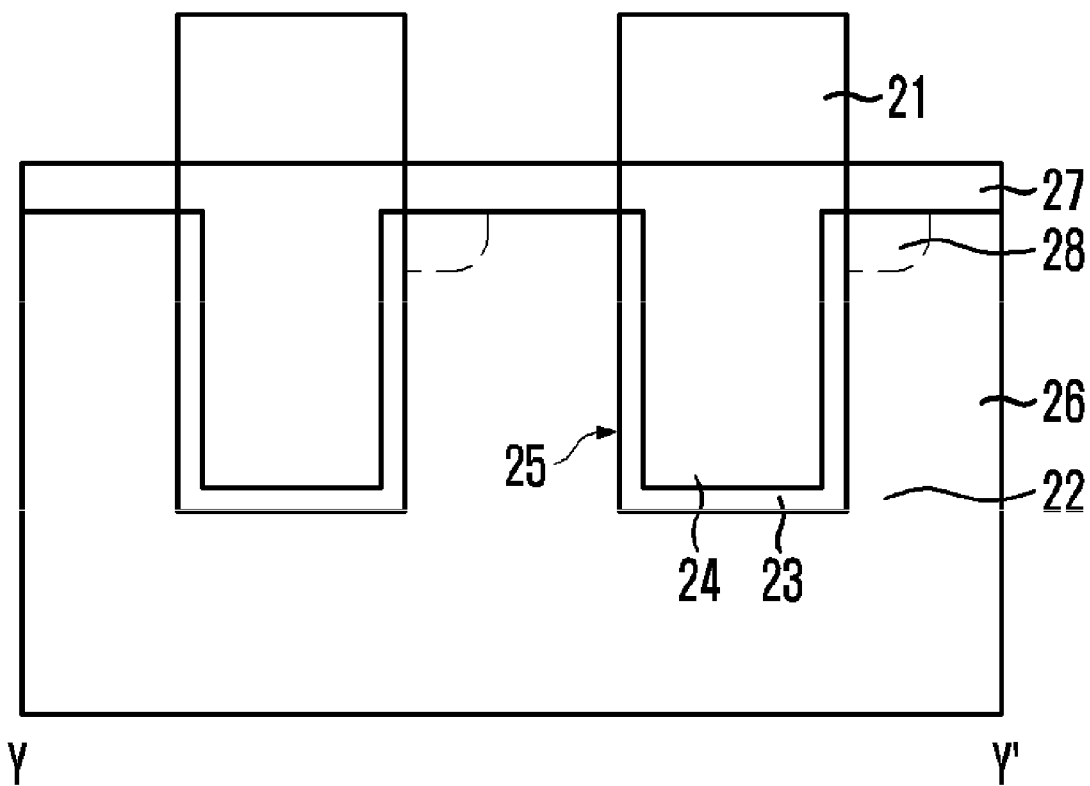

FIGS. 2A to 2C illustrate cross-sectional views of a semiconductor device having a vertical channel. FIG. 2B illustrates a cross-sectional view taken along a line X-X' of the semiconductor device shown in FIG. 2A. FIG. 2C illustrates a cross-sectional view taken along a line Y-Y' of the semiconductor device shown in FIG. 2A.

Referring to FIGS. 2A to 2C, the semiconductor device having vertical channels includes a plurality of line patterns 21, a plurality of buried bit lines 22, and a plurality of gate electrodes 24. The line patterns 21 may be referred to as word lines. The semiconductor device includes a plurality of source and drain regions formed in the upper and lower portions of the semiconductor device to form the vertical channels. The source and drain regions formed in upper portions of a substrate 26 are referred to as upper source and drains 28. The buried bit lines 22 represent the source and drain regions formed in the lower portion of the substrate 26. Reference numeral 23 represents gate insulation layers 23.

Line patterns 21 are conductive patterns formed to couple the gate electrodes 24 and may include one of a polysilicon layer and a metal layer.

The gate electrodes 24 are formed over trenches 25. The gate electrodes 24 may include one of a polysilicon layer and a metal layer. Upper and lower portions of the substrate 26 formed as sidewalls of the trenches 25 correspond to the regions where the vertical channels are to be formed. Thus, the length of the vertical channels becomes longer as the depth of the trenches 25 becomes deeper. Also, the sidewalls of the trenches 25 may include flections to increase the length of the vertical channels. Thus, the trenches 25 may be formed in a polygonal or rounded shape.

The buried bit lines 22 intersect the line patterns 21, coupling the source and drain regions of the gate electrodes 24.

Because contact between the upper source and drains 28 and the line patterns 21 has to be prevented, the upper source and drains 28 and the line patterns 21 are isolated by an isolation layer 27. The isolation layer 27 may include one of an oxide-based layer and a nitride-based layer.

The semiconductor device illustrated above may be formed by a method for forming a semiconductor device, as described below.

Figure 4:
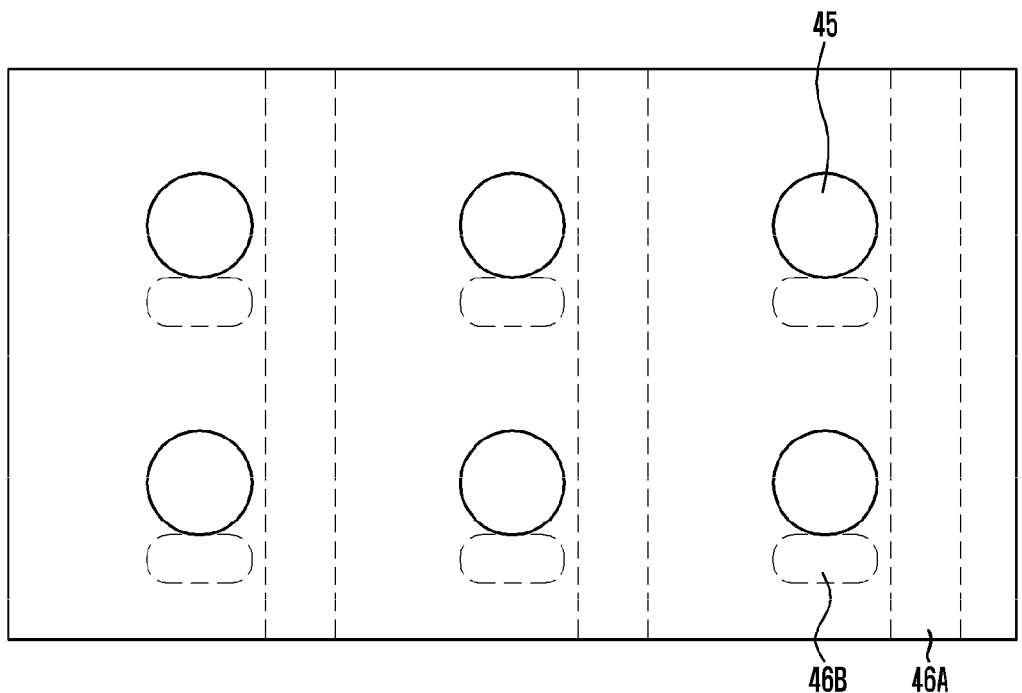
FIG. 4 illustrates a plan view of the semiconductor device shown in FIG. 3C.
Figure 5:
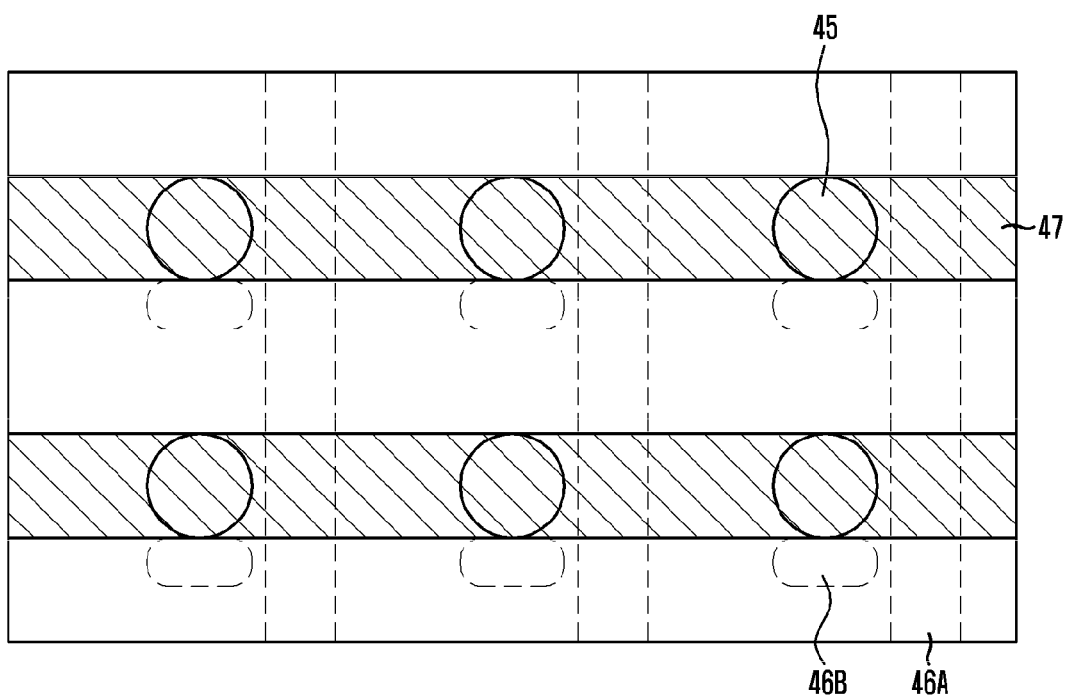
FIG. 5 illustrates a plan view of the semiconductor device shown in FIG. 3D.

FIGS. 3A to 3D illustrate cross-sectional views of one embodiment of a method for fabricating a semiconductor device. FIG. 4 illustrates a plan view of the semiconductor device shown in FIG. 3C. FIG. 5 illustrates a plan view of the semiconductor device shown in FIG. 3D.

Figure 3A:
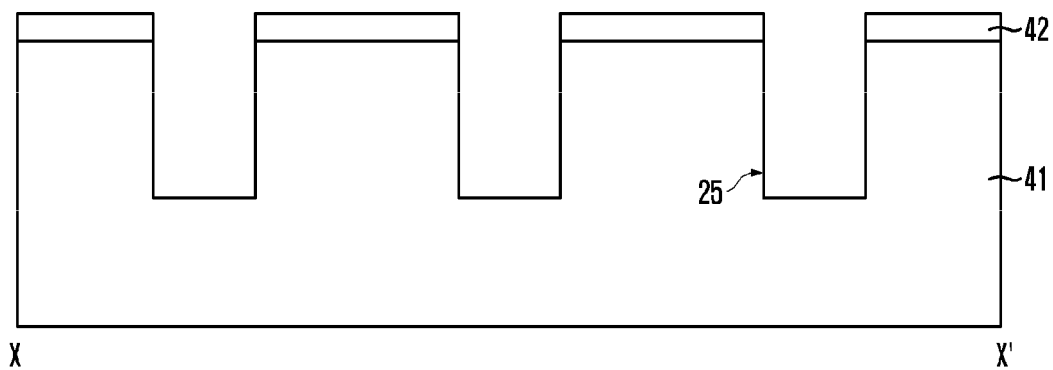
FIGS. 3A to 3D illustrate cross-sectional views of a method for fabricating a semiconductor device.

Referring to FIG. 3A, a padding pattern 42 is formed over a substrate 41. The padding pattern 42 is a hole type pattern. The substrate 41 is etched using the padding pattern 42 as an etch barrier to form a plurality of trenches 43. An etch process may be additionally performed to sidewalls of the trenches 43 so that the sidewalls may be formed in a polygonal or rounded shape. Increasing the vertically length of the sidewalls of the trenches 43 results in increasing the length of channels. The padding pattern 42 may be a stack structure of a pad oxide layer and a pad nitride layer.

Figure 3B:
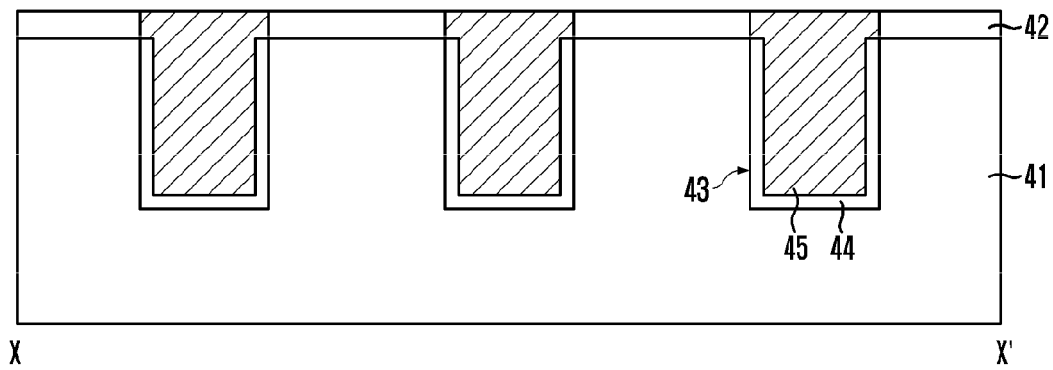
Figure 3C:
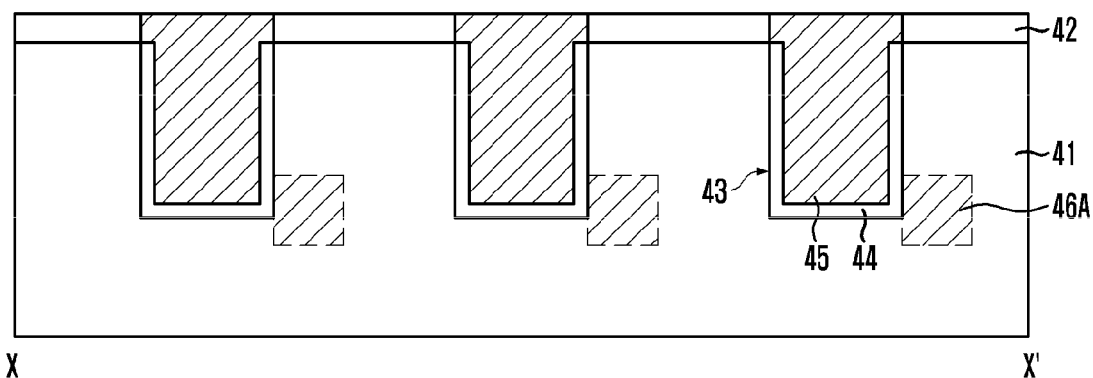

Referring to FIG. 3B, a gate insulation layer 44 is formed over the surface profile of the trenches 43. Then, a conductive layer is filled in the trenches 43 to form gate electrodes 45. The gate electrodes 45 may include one of a polysilicon layer and a metal layer. Reference numeral 44A refers to remaining gate insulation layers 44A after the gate electrodes 45 are formed.

When forming the gate electrodes 45 with a polysilicon layer, the gate electrodes 45 may be formed using a deposition process or by using both deposition and epitaxial growth processes. In particular, performing a deposition process first and then performing an epitaxial growth process results in prevention of void formation in the polysilicon layer.

Portions of the substrate 41 adjacent to lower portions of the sidewalls of the trenches 43 are doped with impurities to form first source and drains 46A. Portions of the substrate 41 adjacent to upper portions of the sidewalls of the trenches 43 are doped with impurities to form second source and drains 46B (shown in FIG. 4).

The first source and drains 46A function as line type buried bit lines to couple the adjacent gate electrodes 45. The first source and drains 46A formed as buried bit lines coupling the adjacent gate electrodes 45 are shown in FIG. 4. The second source and drains 46B are also shown in FIG. 4.

Figure 3D:
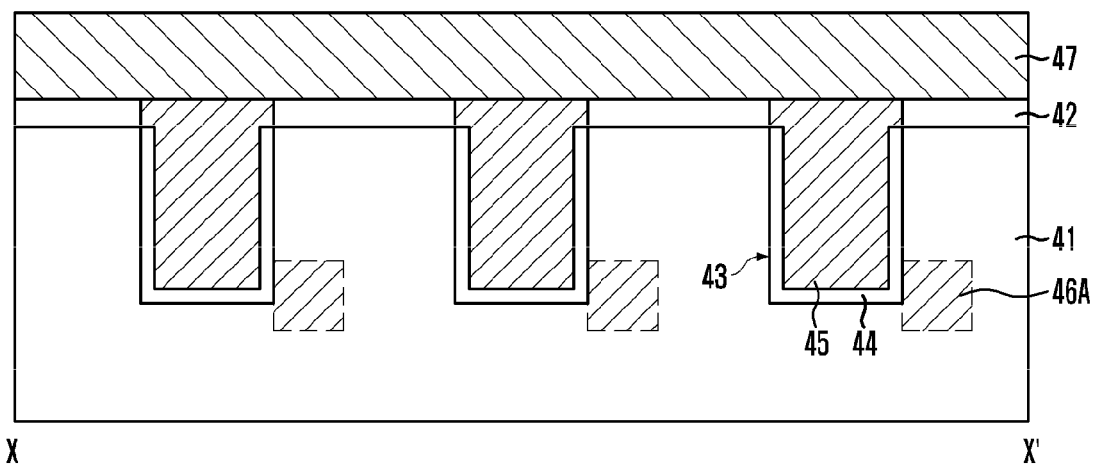

Referring to FIG. 3D, line patterns 47 are formed to intersect the first source and drains 46A. The line patterns 47 couple the adjacent gate electrodes 45.

The line patterns 47 deliver operation voltage to gates. Thus, the line patterns 47 may include one of a polysilicon layer and a metal layer. The line patterns 47 coupling the adjacent gate electrodes 45 are shown in FIG. 5.

The line patterns 47 and the second source and drains 46B are isolated by the padding pattern 42. The padding pattern 42 corresponds to the isolation layer 27 shown in FIG. 2B. Thus, the semiconductor device including vertical channels is formed.

According to at least one embodiment, trenches 43 are formed to prevent collapse of pillar patterns and to stably form vertical channels. The vertical channels are formed using the sidewalls of the trenches 43.

Accordingly, because pillar patterns are not needed in this embodiment, a semiconductor device having stably formed vertical channels may be fabricated.

Furthermore, compared to typical methods whereby it is difficult to increase the length of pillar patterns in order to reduce pillar pattern collapsing events and which therefore limit the length of vertical channels, the depth of the trenches 43 in this embodiment may be stably extended, and thus the length of the vertical channels may be increased.

Various changes and modifications may be made without departing from the spirit and scope of the invention as defined in the following claims.

What is claimed is:

1. A semiconductor device, comprising:
   a plurality of trench patterns formed over a substrate, the plurality of trench patterns defining a plurality of trenches;
   gate insulation layers formed over sidewalls of the trenches;
   gate electrodes formed in the trenches, wherein the gate electrodes completely fill inner spaces of the trenches on the gate insulation layer;
   line patterns coupling the gate electrodes; and
   source and drain regions formed in upper and lower portions of the substrate adjacent to the sidewalls of the trenches,
   wherein when the source region is formed in the upper portion of the substrate, the drain region is formed in the lower portion of the substrate, and when the source region is formed in the lower portion of the substrate, the drain region is formed in the upper portion of the substrate,
   wherein the source and the drain regions formed in the lower portions of the substrate are buried bit lines, the buried bit lines being not faced with a bottom surface of the gate electrodes and being faced with sidewalls of the gate electrodes.

2. The semiconductor device of claim 1, wherein the sidewalls of the trenches include flections.

3. The semiconductor device of claim 1, wherein the sidewalls of the trenches are formed in one of a polygonal and rounded shape.

4. A method for fabricating a semiconductor device, comprising:
   forming a plurality of trench patterns over a substrate, the plurality of trench patterns defining a plurality of trenches;
   forming gate insulation layers over sidewalls of the trenches;
   forming gate electrodes in the trenches, wherein the gate electrodes completely fill inner spaces of the trenches on the gate insulation layer;
   forming source and drain regions in upper and lower portions of the substrate adjacent to the sidewalls of the trenches; and
   forming line patterns coupling the gate electrodes,
   wherein when the source region is formed in the upper portion of the substrate, the drain region is formed in the lower portion of the substrate, and when the source region is formed in the lower portion of the substrate, the drain region is formed in the upper portion of the substrate,
   wherein the source and drain regions formed in the lower portions of the substrate are buried bit lines, the buried bit lines being not faced with a bottom surface of the gate electrodes and being faced with sidewalls of the gate electrodes.

5. The method of claim 4, wherein the sidewalls of the trenches include flections.

6. The method of claim 4, wherein the sidewalls of the trenches are formed in one of a polygonal and rounded shape.

7. The method of claim 4, wherein the gate electrodes are formed by filling the inner spaces of the trenches with a conductive layer comprising one of a polysilicon and a metal layer.

* * * * *